United States Patent [19]
Rink

[11] Patent Number: 5,850,724
[45] Date of Patent: Dec. 22, 1998

[54] POCKET TAPE SEALING AND UNSEALING METHOD AND APPARATUS

[75] Inventor: Philip A. Rink, Everett, Wash.

[73] Assignee: CNA Manufacturing Systems, Inc., Redmond, Wash.

[21] Appl. No.: 612,587

[22] Filed: Mar. 8, 1996

Related U.S. Application Data

[62] Division of Ser. No. 221,864, Mar. 31, 1994, Pat. No. 5,515,992.

[51] Int. Cl.[6] ................. B65B 7/28; B67B 3/22
[52] U.S. Cl. ................. 53/486; 53/289
[58] Field of Search ............. 53/486, 289, 467, 53/471, 314, 282

[56] References Cited

U.S. PATENT DOCUMENTS

| | | | |
|---|---|---|---|
| 3,261,459 | 7/1966 | Anderson et al. | 206/56 |
| 3,295,293 | 1/1967 | Lodding | 53/486 |
| 3,487,622 | 1/1970 | Mueller | 53/289 X |
| 3,523,608 | 8/1970 | Miller | 220/23.8 X |
| 3,647,055 | 3/1972 | Pfaff | 220/23.8 X |
| 3,650,430 | 3/1972 | Siegmar et al. | 220/23.8 |
| 4,274,195 | 6/1981 | Spörer | 29/741 |
| 4,298,120 | 11/1981 | Kaneko et al. | 206/329 |
| 4,378,625 | 4/1983 | Crisman et al. | 53/486 X |
| 4,380,447 | 4/1983 | VanderLugt, Jr. | 53/486 X |
| 4,460,825 | 7/1984 | Haghiri-Tehrani et al. | 235/488 |
| 4,583,641 | 4/1986 | Gelzer | 206/330 |
| 4,592,466 | 6/1986 | Walters et al. | 206/150 |
| 4,702,788 | 10/1987 | Okui | 156/252 |
| 4,708,245 | 11/1987 | Boeckmann et al. | 220/23.8 X |
| 4,757,895 | 7/1988 | Gelzer | 206/330 |
| 4,781,953 | 11/1988 | Ball | 428/35 |
| 4,805,771 | 2/1989 | Hein | 206/332 |
| 4,867,308 | 9/1989 | Crawford et al. | 206/330 |
| 4,898,275 | 2/1990 | Skrtic et al. | 206/330 |
| 4,921,192 | 5/1990 | Van Erden | 206/470 |
| 4,944,979 | 7/1990 | Gagliano et al. | 428/43 |
| 5,012,924 | 5/1991 | Murphy | 206/331 |
| 5,025,923 | 6/1991 | Okui | 206/329 |
| 5,046,610 | 9/1991 | Runyon et al. | 206/330 |
| 5,109,981 | 5/1992 | Maston, III et al. | 206/331 |
| 5,115,911 | 5/1992 | Schulte et al. | 206/330 |
| 5,132,160 | 7/1992 | Bird | 428/159 |
| 5,150,787 | 9/1992 | Bird et al. | 206/329 |
| 5,199,564 | 4/1993 | Skrtic | 206/330 |

*Primary Examiner*—Horace M. Culver
*Attorney, Agent, or Firm*—Dellett and Walters

[57] ABSTRACT

A component pocket tape which resists inadvertent unsealing includes a tape cover having discrete edge portions with gaps therebetween such that when one edge portion is unsealed or bent, subsequent edge portions will not unseal or bend unless such unsealing or bending is desired. An apparatus for unsealing and sealing pocket component tape includes a component tape deforming portion and a plow portion which urges the tape and the component tape cover together whereupon the tape deforming portion releases the tape so as to allow the tape to expand into the tape engaging portion of the cover. For unsealing, the apparatus may be run in reverse such that the tape is deformed and then the plow portion drives the tape and cover apart such that when the deforming portion releases the tape, the tape returns to its original configuration but is separated from the tape cover.

8 Claims, 5 Drawing Sheets

POCKET TAPE SEALING AND UNSEALING METHOD AND APPARATUS

This is a divisional of application Ser. No. 08/221,864 filed on Mar. 31, 1994, now U.S. Pat. No. 5,515,992.

BACKGROUND OF THE INVENTION

This invention relates to component pocket tape feeding systems and more particularly to a sealing and unsealing method and apparatus and an improved pocket tape cover which is not inclined to become inadvertently separated from the pocket tape.

In automated manufacturing, particularly in electronic manufacturing, components are often provided in a component pocket tape wherein a number of components are delivered in a roll with each component being placed within its own individual pocket. The tape suitably employs a single piece cover which is applied to the tape when the components are loaded into the tape and is then removed when the components are unloaded, suitably by a component pocket tape feeder.

In accordance with the prior art, the cover for the component pocket tape is suitably a single piece with latching portions on opposite edges thereof such that the latching portions engage flanges on the edges of the component pocket tape. FIG. 9 is a cross-sectional view of the cover portion of a prior art pocket component tape cover as attached to a component pocket tape 18. It will be noted that the prior art cover includes two distended bulbous portions 10, 12 near the left and right edges of the cover. As shown in FIG. 10, a typical prior art method of applying the cover to the pocket tape is to latch hook portion 14, for example, over flange 32 at one side of the component tape whereupon downward pressure is applied on bulb 12, indicated by arrow 15, which causes hook portion 16 to flex outwardly in the direction of arrow 13 whereupon the downward pressure causes the hook to pop over the flange 34 at the opposite edge of the component tape thereby sealing the tape. Alternatively, the tape cover is held against downward movement while the bulb 12 is depressed in the direction of arrow 15. Once the tape cover latch 16 has flexed outwardly along the arc 13, the pocket tape 18 is moved upwardly along the line indicated by arrow 11. Then, the downward pressure 15 is released, and in the absence of pressure, latch portion 16 returns to its original configuration. However, since the tape 18 has been moved upwardly, hook portion 16 now securely latches flange 34 of tape 18. Thus, the tape cover is moved in sideways in the direction of arrow 20 to initially hook portion 14 against one side of the tape and through application of a deforming force and subsequent removal, hook portion 16 is caused to engage the other side of the tape.

FIG. 11 is a cross-sectional view of a pocket component tape cover in accordance with FIG. 9 illustrating steps in unsealing the cover from the tape. To separate the cover from the tape, downward pressure is applied to bulb portions 10 and 12, suitably in simultaneous fashion, thereby causing hook portions 14 and 16 to bow outwardly as indicated by arrows 25 and 27 respectively, effectively unlatching the hook portions from the flanges 32 and 34 of the pocket tape. While the downward pressure at arrows 17 and 19 is maintained, the pocket tape is then pulled downwardly in the direction of arrow 23, away from the cover. Once the pocket tape has been pulled away from the cover, the pressure at arrows 17 and 19 may then be removed to allow the cover to return to its original undeformed shape. Alternatively, the cover can be pulled away from the pocket tape in the direction of arrow 21, rather than or in addition to the movement of the pocket tape away from the tape cover.

Such methods of sealing and unsealing are generally acceptable in component tapes up to 56 millimeters in width. However, in larger widths, in order to ensure that the cover remains on the tape, hook portions 14 and 16 must be made much longer, thereby requiring that bulbs 10 and 12 be depressed to a greater extent in order to either get hook portion 16 to link up with the tape or to allow hook portions 14 and 16 to release from the tape. This leads to permanent deformation of bulb portions 10 and 12, ultimately resulting in a cover that does not function properly or is not reusable.

A further difficulty with prior art systems is that the cover becomes somewhat stiff in larger widths and is inclined to pop off the component tape. One reason that the cover tends to pop off is that the pocket tape bends in straight segments, i.e., the segment of the tape adjacent the pocket remains straight whereupon the area between two pockets is allowed to bend. However, the cover tends to bend in a curved manner and therefore is inclined to pop off as the tape bends in its segmented manner. Referring to FIG. 12, the segmented bending of the tape is illustrated wherein bends occur at points 22 and 24 which are between adjacent pockets 26, 28 and 30. However, the cover 18 bends in the curved manner as illustrated in FIG. 12, and is therefore unable to satisfactorily accommodate the linearly segmented bending of the pocket tape.

The tape cover as employed in the prior art however has a related disadvantage in that once a portion of the cover is unlatched from the tape, the cover has a tendency to continue unlatching from the tape, much like an unzipping action. Such action is highly undesirable since the unzipping typically occurs when loading or unloading a roll of tape into a feeding system, thereby spilling parts from the individual pocket around the assembly area. When the component tape contains delicate parts which are precision machined, for example, such scattering could damage the parts and make them unsuitable for use.

A further difficulty with the cover according to the prior art is that even in tape widths less than 56 mm, after a number of iterations of depressing the bulbs 10 and 12, both in latching and unlatching the cover from the tape, the bulbs tend to become permanently deformed and no longer provide the proper bowing action to hook portions 14 and 16 when depressed, thereby destroying the reusability of the cover.

SUMMARY OF THE INVENTION

In accordance with the present invention a pocket tape sealing and unsealing apparatus includes a plow portion which is adapted to insert between a pocket component tape cover and the pocket tape and to deform the tape rather than deforming the cover as in accordance with the prior art thereby causing the cover to bend and move away from the latch portions of the pocket component tape cover.

A further embodiment includes a sealing mechanism which operates according to the unsealing method but in reverse wherein the cover and the tape are brought into close relation to one another and the tape is deformed so as to bend inwardly and is then brought closer to the cover. Once the tape is sufficiently close to the cover, the bending force is removed allowing the tape to flex back to its original configuration wherein it expands into and is engaged by the tape cover hook portions.

A further embodiment of the invention includes an improved component pocket tape cover wherein the cover is not a continuous straight piece on the edges thereof but instead includes discrete edge portions with apertures therebetween such that the cover does not continue to unpeel once a portion is unpeeled unless such unpeeling is specifically being performed.

It is accordingly an object of the present invention to provide an improved pocket component tape unsealing apparatus and method.

It is a further object of the present invention to provide an improved pocket component tape sealing method and apparatus.

It is yet a further object of the present invention to provide an improved pocket component tape with a cover that does not continue to unseal in an undesired manner once unsealing is begun.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

Figure 1A:
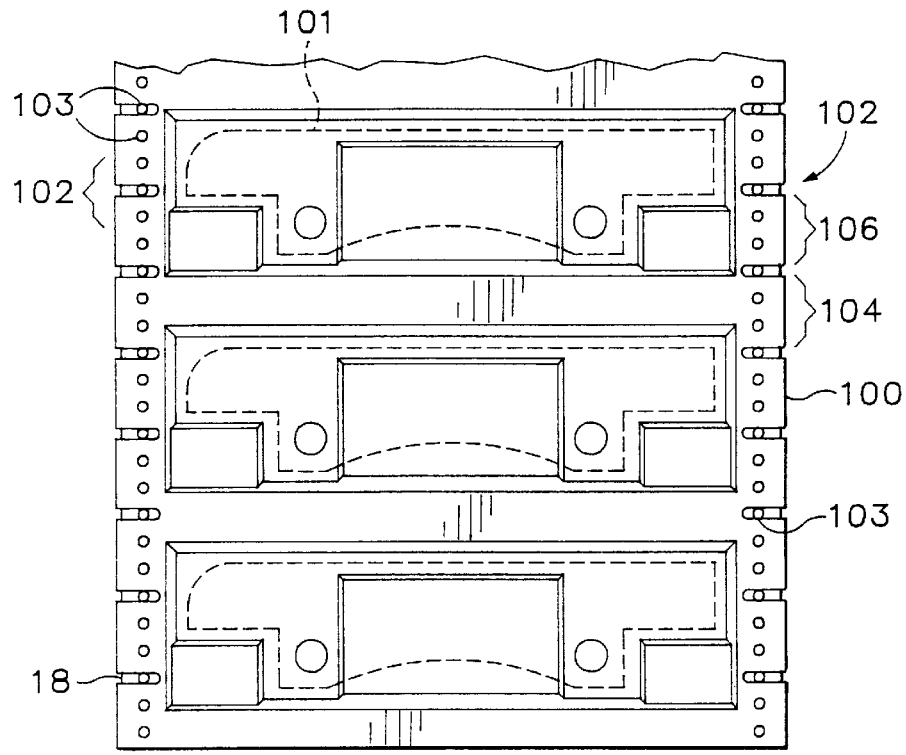
FIG. 1A is a top view of a component pocket tape with a cover attached thereto in accordance with the present invention.
Figure 12:
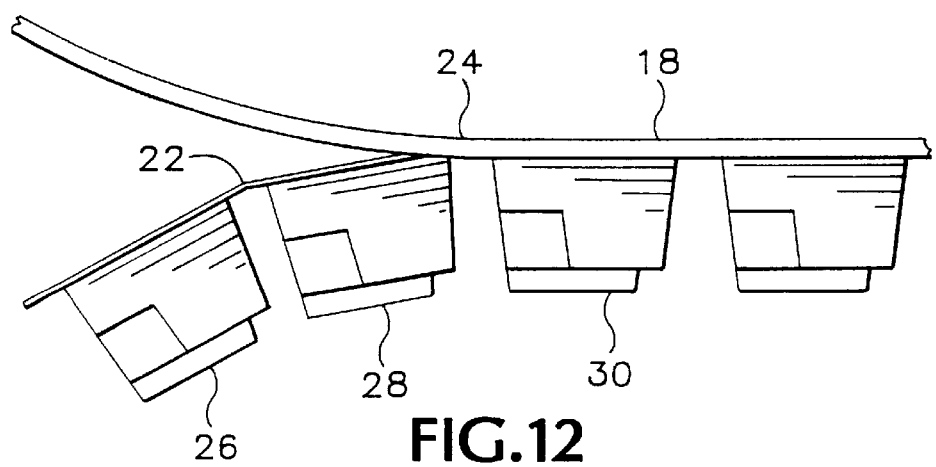
FIG. 12 is a diagrammatic view of a pocket component tape taken as a cross section longitudinally illustrating the bending of the tape in segments.

Referring now to FIG. 1A, a top view of a component pocket tape with a cover attached thereto in accordance with the present invention, the cover 100 may be observed to have a series of apertures 102 provided in spaced arrangement on each lateral edge of the cover such that a given portion 104 of cover 100 may flex or bend out of the plane of the cover somewhat independently of the adjacent cover portion 106. Thus, an advantage is provided over the tape covers of the prior art, since as noted hereinabove in conjunction with FIG. 12, the component tape will tend to bend in linear segments. The cover of the present invention is also able to bend in a segmented manner and is not inclined to become disconnected from the tape as is likely with the prior art. The cover suitably fits over a pocket component tape 18, which may carry components 101, illustrated in phantom, in individual pockets. The pocket tape also includes a series of drive sprocket receiving holes 103, for allowing engagement between the tape and a driving mechanism as discussed in conjunction with FIG. 2 hereinbelow.

Figure 1B:
FIG. 1B is an end view of a component pocket tape with a cover attached thereto in accordance with the present invention.

FIG. 1B is an end view of a component pocket tape with a cover attached thereto in accordance with the present invention. Hook portions 105 and 107 at the longitudinal edges of the cover are adapted to engage flange portions 32 and 34 of the pocket component tape. It may be observed that cover 100 is substantially flat and does not require the bulbous portions 10 and 12 of the prior art type covers. However, the cover can also be manufactured with such bulbous portions to allow use with prior art type sealing and unsealing methods or to enable use with feeding mechanisms that require such bulbs to provide clearance for the engagement of drive pins with the pocket tape.

While the illustrated embodiment provides apertures to allow flexing of the tape cover at certain points thereof, alternative embodiments can employ thinner or more flexible material in spaced arrangement similar to the spaced arrangement of the apertures to provide the desired cover bending. Typically the covers are made of plastics, so bands of different plastics could be joined together to provide the cover with desired flexing properties.

Figure 2:
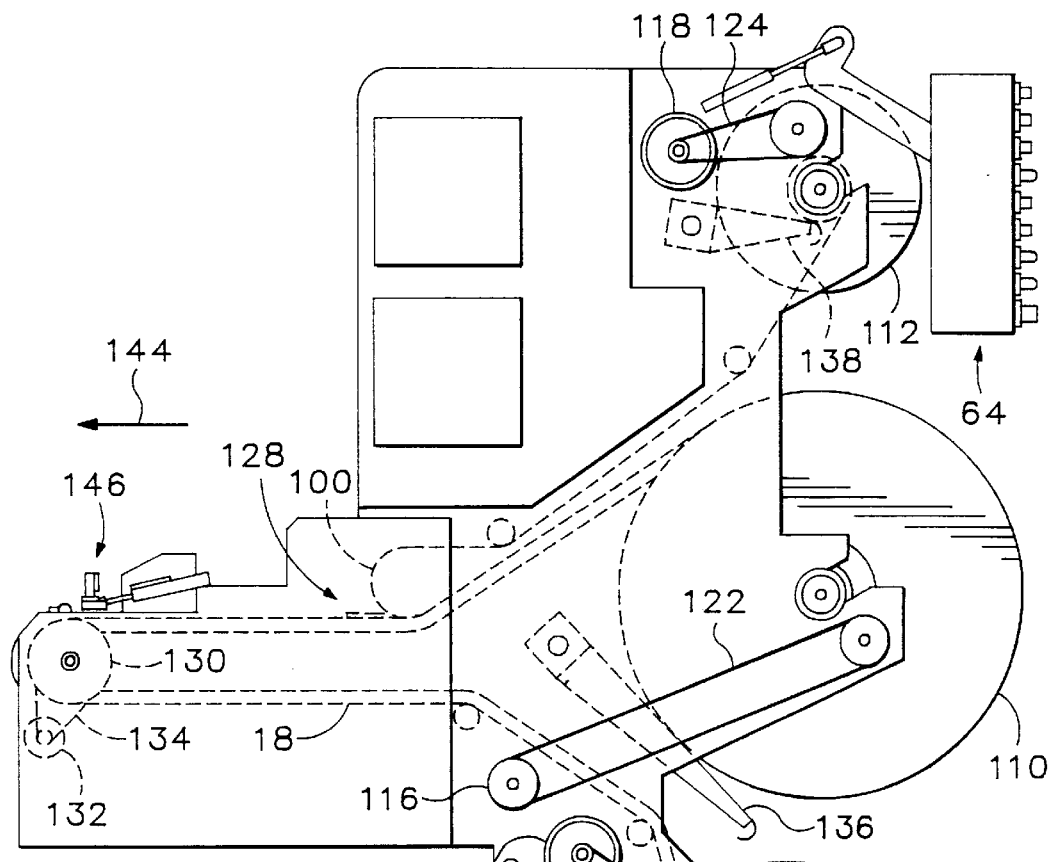
FIG. 2 is side view of a pocket component tape feeding machine employing the unsealing method and apparatus of the present invention.

FIG. 2, a side view of a pocket component tape feeding machine 108 employing the unsealing method and apparatus of the present invention, is provided by way of example to illustrate a particular application of the present invention. A rotatably mounted reel 110 of component tape supplies pre-loaded tape with attached cover. The machine 108 is also provided with a cover takeup reel 112 for receiving the component tape cover, while a second takeup reel 114 receives the bottom portion of the component tape after components have been extracted therefrom. Each of reels 110, 112 and 114 is driven by a respective motor 116, 118 or 120, each motor driving a belt 122, 124 and 126 to rotationally empower the appropriate reel.

The component tape feeder machine 108 further employs a cover removing mechanism 128 in accordance with the present invention for separating the component tape cover 100 from the component tape bottom portion 18. A series of guides directs the component tape cover to the takeup reel 112. Tape feeder 108 is further provided with a tape sprocket wheel 130 which includes a plurality of teeth thereon for engaging feeder holes in the tape. While only one such sprocket wheel is visible in FIG. 2, the tape feeder employs a pair of aligned sprocket wheels, one for each side of tape 18. One of the sprocket wheels 130 is powered by stepper motor 132 wherein power transfer from the motor to the sprocket is accomplished via drive belt 134. The second sprocket wheel is driven via an axle (not shown) joining the sprocket wheels. The component tape feeding mechanism also includes a roller wheel (not shown) in engaging relation with sprocket wheel 130 and functioning to ensure the component tape is in firm engagement with the teeth of the sprocket wheel in order to guard against slippage.

Each of the reels, reel 110, cover reel 112 and takeup reel 114 includes a reel size measurement member 136, 138 or 140, which is suitable for providing feedback to enable adjustment of tension of motor 116, 118 or 120 for keeping the respective component tape constituents tightly wound on a reel during operation of the system. A control panel 64 is suitably provided with a number of control switches and indicators for directing operation of the machine. Interface cable 142 allows external devices to control and monitor operation of the component tape feeder system.

In operation, a reel of pocket tape 110 with components installed therein and including a tape cover 100 is loaded onto the system and the component tape is fed through to cover remover 128. At this point, cover remover 128 removes the tape cover 100 as discussed hereinbelow and the same is fed to takeup reel 112. Bottom portion 18 of the component tape continues on and is fed around sprocket wheels 130. The tape loops around wheels 130 and is fed back so as to be wound by takeup reel 114 for disposal (or reuse) once the reel is full. Sprocket wheels 130 advance the tape in the direction of arrow 144 in normal operation until a pocket holding a part is located at point 146 wherein further operations are performed, which depending upon the particular application may comprise retrieval of a part from a pocket by, for example, a robot or other such assembly device for picking up the part from the pocket tape. After the part has been removed from the tape, the tape is ready to advance to appropriately position a subsequent part at the operation point 146.

Figure 3:
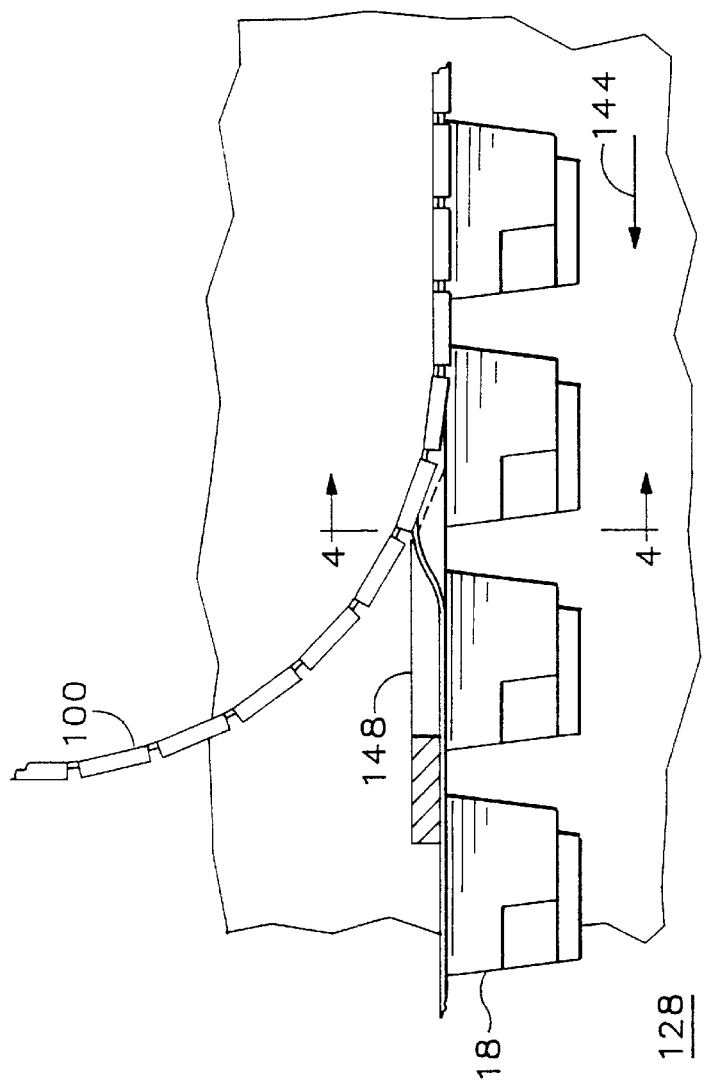
FIG. 3 is a side-sectional view of a tape unsealing apparatus of the present invention.

Referring now to FIG. 3, a side-sectional view of a tape unsealing apparatus 128 in accordance with the present invention and as installed on tape feeder apparatus 108 of FIG. 2, a tapered plow 148 is provided to span a substantial portion of the width of the tape cover 100. The plow is positioned between the tape cover and bottom portion 18, with a narrowed leading edge relative to the direction of tape travel and operates to separate the tape cover from the tape as the tape is fed in the direction of arrow 144. Once removed, the cover is then fed to take up reel 112 (FIG. 2) for storage and re-use.

Figure 4:
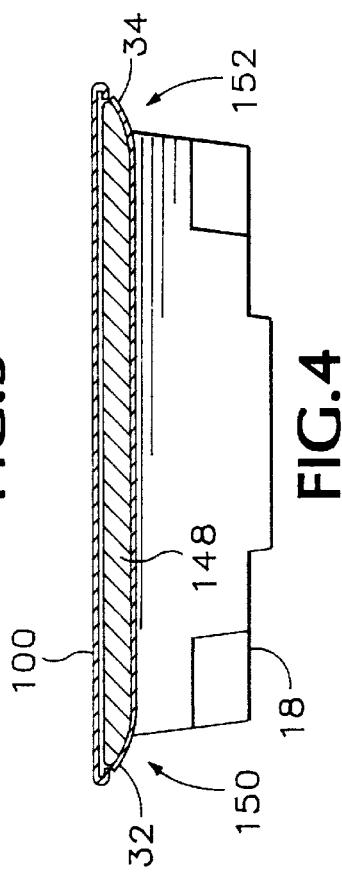
FIG. 4 is a cross-sectional view of the tapered plow portion of the unsealing apparatus of the present invention taken along line 4—4 of FIG. 3.

In FIG. 4, a cross sectional view of the tapered plow 148 taken along lines 4—4 of FIG. 3, the operation of the tapered plow in separating the cover from the tape may be observed. As the cover and tape are moved in the direction of arrow 144 (FIG. 3), the plow drags the cover upwardly, which causes the flanges 32 and 34 at the edges of the pocket tape to bend upwardly, as indicated at 150 and 152 in FIG. 4. This upward bending is sufficient to cause the cover to become unhooked from the edges of the pocket tape. The cover is then pulled upwardly, away from the tape to be stored on a take up reel, for example, while, in the particular illustrated application, the pocket tape continues onward for further processing.

Figure 5:
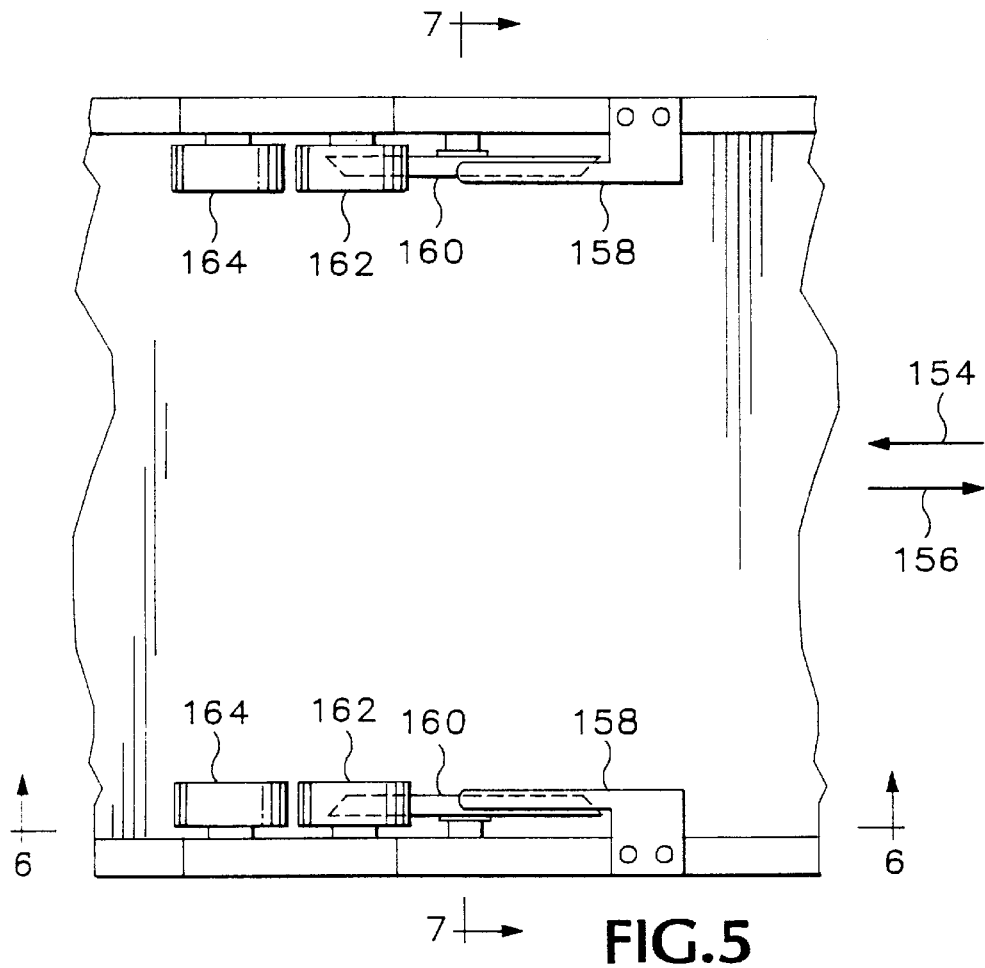
FIG. 5 is a top view of a component tape sealing and unsealing apparatus according to another embodiment of the present invention.

Referring now to FIG. 5, a top view of a component tape sealing and unsealing apparatus according to another embodiment of the present invention, sealing is accomplished by driving the cover and tape in the direction of arrow 154, while unsealing may be accomplished by moving the cover and tape in the direction of arrow 156. This sealing and unsealing apparatus comprises a pair of pinch arms 158 which are mounted to engage the flanges at the left and right distal edges of the component tape when the tape is passed through the apparatus. The pinch arms are finger-like in appearance, with the distal end of each arm being positioned above a bending roller 160. The bending rollers are rotationally mounted below the plane of travel of the pocket tape, with a portion of the roller extending up above the plane of the pocket tape cover. A pair of guide rollers 162 and 164 are placed above the plane of the tape and cover at the opposite side of the center of bending rollers 160. The guide rollers serve to assist in keeping the tape and cover traveling over bending rollers 160 during operation.

Figure 6:
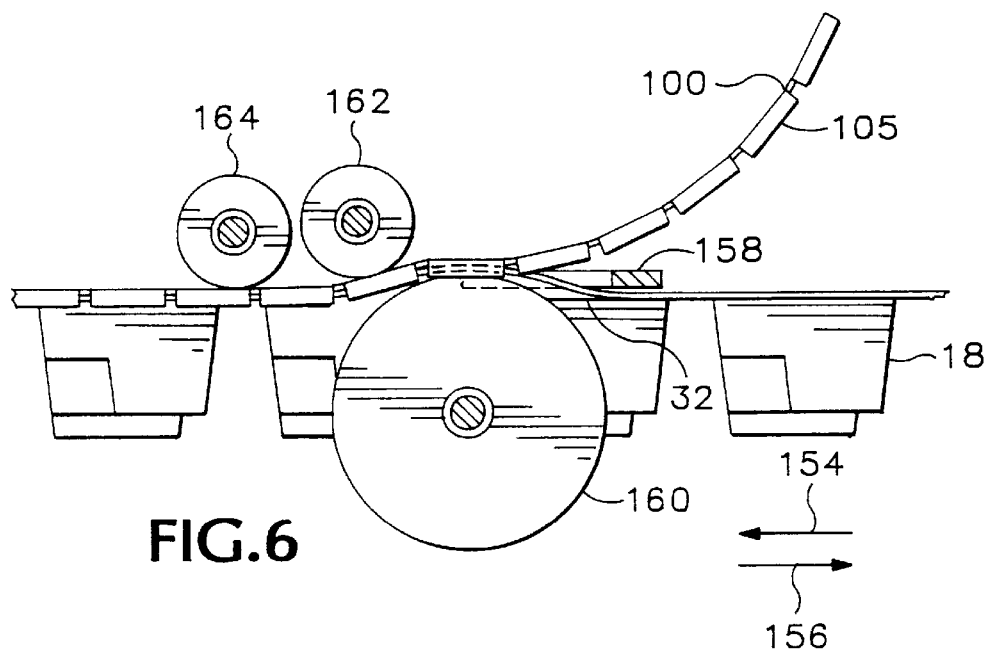
FIG. 6 is a side view of a component tape sealing and unsealing apparatus taken along line 6—6 of FIG. 5 illustrating the tape deforming portions.
Figure 10:
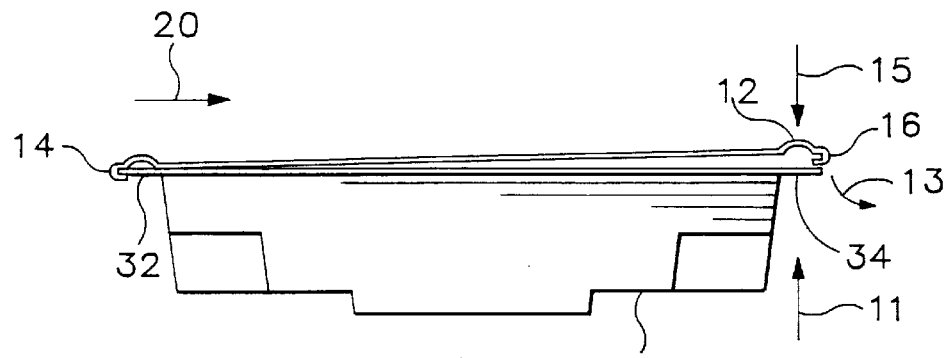
FIG. 10 is a cross-sectional view of a pocket component tape cover in accordance with FIG. 9 illustrating steps in sealing the cover to the tape.
Figure 11:
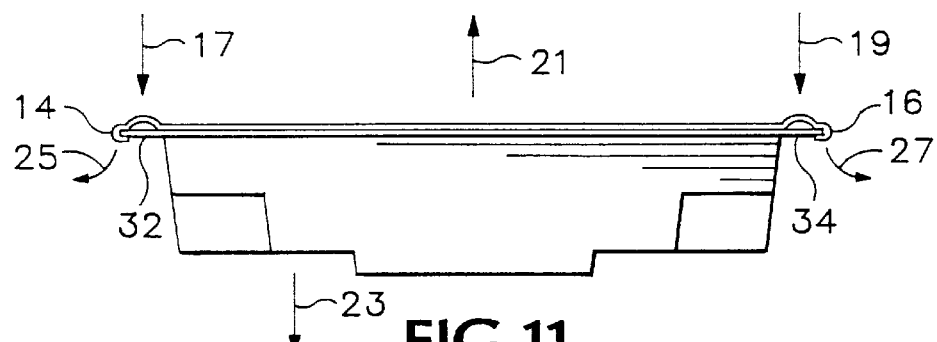
FIG. 11 is a cross-sectional view of a pocket component tape cover in accordance with FIG. 9 illustrating steps in unsealing the cover from the tape.

FIG. 6 is a side view of a component tape sealing and unsealing apparatus taken along line 6—6 of FIG. 5, illustrating the tape deforming portions. This apparatus is operative to seal the cover 100 to tape 18 when the tape and cover are driven in the direction of arrow 154. As the tape runs through the apparatus, the flanges at the edges of the tape run up over bending rollers 160, causing the tape flanges to bend upwardly. At the same time, cover 100 is fed onto the bent up flanges and through guide rollers 162 and 164. The guide rollers keep the cover in contact with the tape as the tape continues to move in the direction of arrow 154 and off of bending rollers 160. As the tape continues off of rollers 160, the tape flanges will bend back to their original configuration, whereupon the hook portions 105 and 107 of the cover 100 will engage the flanges 32 and 34 respectively. Sealing is thereby accomplished.

Figure 7:
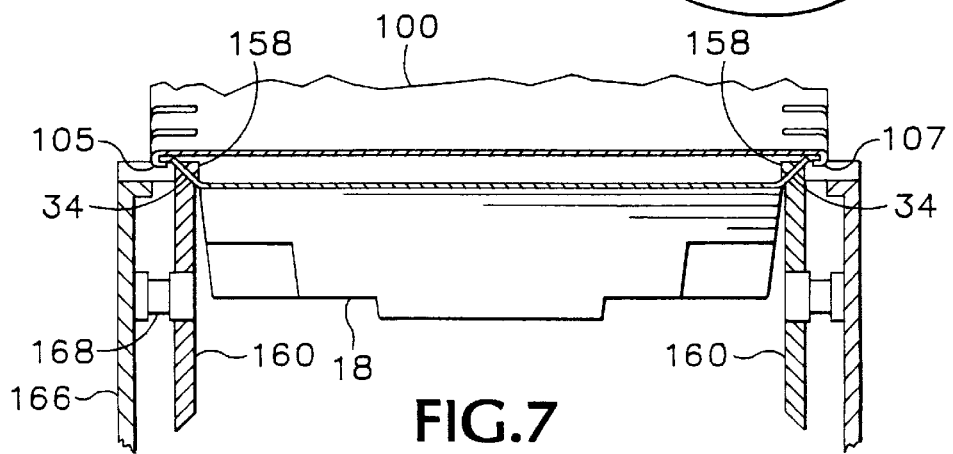
FIG. 7 is a sectional view of the sealing and unsealing apparatus of FIG. 5 and FIG. 6 taken along line 7—7 of FIG. 5 illustrating the bending rollers and plows.

FIG. 7 is a sectional view of the sealing and unsealing apparatus of FIG. 5 and FIG. 6 taken along line 7—7 of FIG. 5, illustrating the bending rollers and plows. In FIG. 7, it may be observed that bending rollers 160 are rotationally mounted to a frame 166 via axles 168. Frame 166 may comprise a portion of the overall apparatus in which the sealing and unsealing is to be accomplished, for example, the feeder apparatus 108 of FIG. 2. The upward bending of the flanges 32 and 34 of the pocket tape 18 may be observed, as a function of the pinch arms 158 and bending rollers 160. The pinch arms keep the tape flanges in close engagement with the bending rollers. Bending rollers 160 are suitably formed with a bevel on the outer circumference thereof, wherein in the illustrated embodiment, the bevel slants inwardly relative to the centerline of the tape and cover. This bevel operates in conjunction with the pinch arms to effect the upward bending of the tape flanges. The cover is brought in close to the upwardly bent tape flanges so that when the tape moves off the bending rollers, the flanges expand outwardly and into hook portions 105 and 107 of the tape cover as they return to their unbent position. Latching of the cover to the tape is thereby accomplished.

Referring again to FIGS. 5–7, when the tape and cover are moved in the direction of arrow 156, unsealing or unlatching of the cover from the tape occurs. In this mode of operation, as the tape and cover move under guide rollers 164 and 162, over the top of bending roller 160 and through pinch arms 158, the flanges of the tape are bent upwardly. Hook portions 105 and 107 of cover 100 are thus disengaged from the tape flanges 32 and 34 and the cover is suitably guided upwardly away from the component tape. The tape continues to move off the bending rollers and the flanges return to their original unbent shape, with the tape and cover now separated. The sealing and unsealing apparatus and method of the embodiment of FIGS. 5–7 is effective to seal and unseal both prior art type pocket tape/cover combinations as well as the improved cover/pocket tape of FIG. 1A and FIG. 1B.

Figure 8:
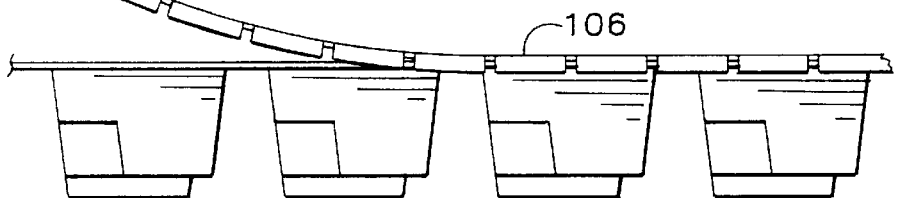
FIG. 8 is a side view of a pocket component tape with a cover partially removed.
Figure 9:
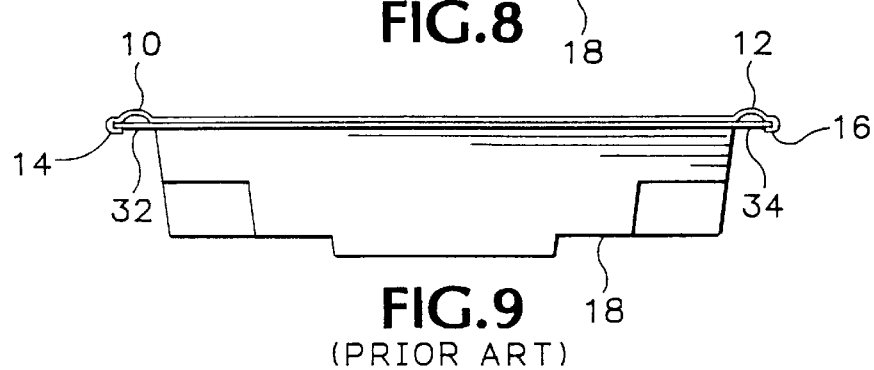
FIG. 9 is a cross-sectional view of a pocket component tape cover according to the prior art.

FIG. 8 is a side view of a pocket component tape with a cover according to the present invention. It may be observed in FIG. 8 that the cover is able to bend in linear segments, unlike prior art covers. Such a feature is advantageous in preventing the cover from inadvertently becoming disconnected from the pocket tape as a result of flexing of the tape, for example.

Thus an improved pocket tape cover and cover/tape sealing and unsealing are accomplished. The cover is able to withstand greater degrees of flexing than allowed with prior art covers, owing in part to the segmenting bending properties of the cover. The sealing and unsealing apparatus provide efficient operation with both prior art type tape covers and the tape covers in accordance with the present invention. Since the sealing and unsealing do not rely on deforming bulbous portions of the tape cover, longer cover life is accomplished, enabling multiple re-use of tape covers.

While plural embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. Apparatus for applying a cover to a pocket component tape, wherein said pocket component tape has first and second longitudinal edges, comprising:

means for deforming said pocket component tape by contacting the first and second longitudinal edges of said pocket component tape to bring the edges closer together and then returning said pocket component tape to its undeformed state to allow said first and second longitudinal edges to move further apart; and means for bringing the cover adjacent the pocket component tape in a region where said first and second longitudinal edges are closer together, whereby when said deforming/returning means allows said first and second longitudinal edges to move further apart, said cover and said pocket component tape are in engaging relation.

2. Apparatus according to claim 1 wherein said means for bringing the cover adjacent the pocket component tape comprise guide roller means.

3. Apparatus according to claim 1 wherein said deforming/returning means comprises a tapered plow.

4. Apparatus for applying a cover to a pocket component tape, wherein said pocket component tape has first and second longitudinal edges, comprising:

means for deforming said pocket component tape to bring the first and second longitudinal edges of said pocket component tape closer together and then returning said pocket component tape to its undeformed state to allow said first and second longitudinal edges to move further apart; and means for bringing the cover adjacent the pocket component tape in a region where said first and second longitudinal edges are closer together, whereby when said deforming/returning means allows said first and second longitudinal edges to move further apart, said cover and said pocket component tape are in engaging relation and wherein said deforming/returning means comprises a beveled wheel across which said pocket component tape is moved, said wheel bending the first and second longitudinal edges of said pocket component tape towards one another.

5. Apparatus according to claim 4 wherein said deforming/returning means further comprises pinch arms positioned adjacent the beveled wheel.

6. Apparatus for applying a cover to a pocket component tape, wherein said pocket component tape has first and second longitudinal edges, comprising:

means for applying a force to said pocket component tape in a vertical direction relative to said first and second longitudinal edges for deforming said pocket component tape to bring the first and second longitudinal edges of said pocket component tape closer together and then removing said force for returning said pocket component tape to its undeformed state to allow said first and second longitudinal edges to move further apart; and means for bringing the cover adjacent the pocket component tape in a region where said first and second longitudinal edges are closer together, whereby when said deforming/returning means allows said first and second longitudinal edges to move further apart, said cover and said pocket component tape are in engaging relation.

7. An apparatus for applying a cover to a pocket component tape, wherein said pocket component tape has first and second longitudinal edges, comprising:

means for deforming said pocket component tape to bring the first and second longitudinal edges of said pocket component tape closer together and then returning said pocket component tape to its undeformed state to allow said first and second longitudinal edges to move further apart, said deforming/returning means positioned between said cover and said pocket component tape so as to apply a force to said cover in an upward direction and so as to apply a force to said pocket component tape in a downward direction relative to said longitudinal edges; and means for bringing the cover adjacent the pocket component tape in a region where said first and second longitudinal edges are closer together, whereby when said deforming/returning means allows said first and second longitudinal edges to move further apart, said cover and said pocket component tape are in engaging relation.

8. A method for applying a cover having hook portions to a component pocket tape comprising the steps of:

contacting so as to bend from a rest state edge flange portions of said component pocket tape to bring said edge flange portions closer together;

moving said cover close to said bent edge flange portions;

unbending said edge flange portions to return said edge flange portions to their rest state, whereby said flange portions and said hook portions of said cover thereby are in engaging relation.

\* \* \* \* \*